United States Patent
Thouault et al.

(10) Patent No.: US 10,013,524 B2
(45) Date of Patent: Jul. 3, 2018

(54) METHOD FOR DESIGNING A TURBINE WITH AN IMPROVED VANE-TO-BLADE RATIO IN THE LAST STAGE OF THE TURBINE

(71) Applicant: MTU Aero Engines AG, Munich (DE)

(72) Inventors: Nicolas Thouault, Munich (DE); Dominik Broszat, Unterfohring (DE)

(73) Assignee: MTU AERO ENGINES AG, Munich (DE)

( * ) Notice: Subject to any disclaimer, the term of this patent is extended or adjusted under 35 U.S.C. 154(b) by 484 days.

(21) Appl. No.: 14/706,272

(22) Filed: May 7, 2015

(65) Prior Publication Data

US 2015/0324517 A1    Nov. 12, 2015

(30) Foreign Application Priority Data

May 12, 2014 (DE) ................. 10 2014 208 883

(51) Int. Cl.
| G06G 7/48 | (2006.01) |
| G06F 17/50 | (2006.01) |
| F02C 7/00 | (2006.01) |
| F01D 5/26 | (2006.01) |
| F01D 25/30 | (2006.01) |

(52) U.S. Cl.
CPC ........... *G06F 17/5095* (2013.01); *F01D 5/26* (2013.01); *F01D 25/305* (2013.01); *F02C 7/00* (2013.01); *F05D 2260/96* (2013.01)

(58) Field of Classification Search
CPC .................................................. G06F 17/5095
USPC ............................................................. 703/6
See application file for complete search history.

(56) References Cited

U.S. PATENT DOCUMENTS

| 7,806,651 B2 * | 10/2010 | Kennepohl ............... F01D 5/10 415/119 |
| 2005/0210860 A1 | 9/2005 | Gutmark et al. |
| 2007/0000232 A1 | 1/2007 | Powell et al. |
| 2011/0123342 A1 | 5/2011 | Topol |
| 2012/0099995 A1 * | 4/2012 | Delvaux .................. F01D 5/30 416/203 |

(Continued)

FOREIGN PATENT DOCUMENTS

| DE | 102007042767 A1 | 3/2009 |
| DE | 112007001683 T5 | 1/2010 |
| EP | 1262636 | 12/2002 |

(Continued)

OTHER PUBLICATIONS

Rose, Dr. Marco, "Tonal Noise at Axial Turbomachinery", Rolls-Royce Deutschland 2012, 52 pp.

(Continued)

*Primary Examiner* — Hugh Jones
(74) *Attorney, Agent, or Firm* — Barlow, Josephs & Holmes, Ltd.

(57) ABSTRACT

A method for designing a turbine of a gas turbine, in particular of an aircraft engine, which has a last stage having a rotating last rotor grid, having a plurality of rotating blades, and an adjacent, downstream, stationary exit guide grid, having a plurality of guide vanes; with the last stage being characterized by a vane-to-blade ratio characteristic quantity, which indicates the ratio of the number of guide vanes to the number of rotating blades.

10 Claims, 3 Drawing Sheets

(56) References Cited

U.S. PATENT DOCUMENTS

2015/0110604 A1\* 4/2015 Calza ..................... F01D 5/16
                                                       415/119

FOREIGN PATENT DOCUMENTS

| EP | 1738061 B1 | 1/2007 |
|----|------------|--------|
| FR | 2908465 A1 | 5/2008 |
| GB | 795652     | 5/1958 |
| GB | 2475140 A  | 5/2011 |

OTHER PUBLICATIONS

European Search Report No. 15166178.2-1610 dated Jul. 20, 2015, 136 pp.

\* cited by examiner

METHOD FOR DESIGNING A TURBINE WITH AN IMPROVED VANE-TO-BLADE RATIO IN THE LAST STAGE OF THE TURBINE

BACKGROUND OF THE INVENTION

The present invention relates to a method for designing a turbine, in particular a low-pressure turbine, a gas turbine, in particular of an aircraft engine, a computer program product for implementing the method, and a correspondingly designed turbine.

Known from our own European Patent EP 1 738 061 B1 and our own parallel U.S. Pat. No. 7,806,651 B2, to which supplemental reference is made and the content of which is explicitly incorporated in full in the present disclosure, is a method for designing a turbine according to the preamble of claim 1 or a turbine according to the preamble of claim 11.

This European Patent proposes the design of upstream stages up to stage B1/V5 of the turbine such that a vane-to-blade ratio characteristic quantity, which indicates the ratio of the number of guide vanes to the number of rotating blades within the stage, lies between a lower cut-off limit for the mode k=−1 of the blade-passing frequency of this stage and an upper cut-off limit for the mode k=−2 of the blade-passing frequency of this stage in noise-critical operating conditions of the turbine, so as to reduce the noise level emitted from the turbine.

BRIEF SUMMARY OF THE INVENTION

An object of an embodiment of the present invention is to improve a turbine of a gas turbine.

This object is achieved by a method and are directed to a corresponding computer program product and a corresponding turbine. Advantageous embodiments of the invention are discussed in detail below.

According to an aspect of the present invention, a turbine of gas turbine that is to be designed or is designed has a last stage or last interaction with a rotating last rotor grid, having a plurality of rotating blades, and an upstream, adjacent, stationary exit guide grid, having a plurality of guide vanes. A stationary inlet guide grid of this last stage, having a plurality of guide vanes, can be arranged upstream in front of the last rotor grid.

The last stage is a last stage of the turbine that is furthest downstream or in the direction of through-flow and, correspondingly, the last rotor grid is the rotor grid that is the last one furthest downstream or in the direction of through-flow of preferably a plurality of rotor grids of the turbine that are positioned axially one behind the other in the direction of through-flow of the turbine and, correspondingly, the exit guide grid that is arranged adjacent to it downstream is, in particular, a so-called turbine exit casing (TEC).

In particular, the turbine can be a single-stage or a multiple-stage low-pressure turbine, which can be arranged in the direction of through-flow downstream after a single-stage or a multiple-stage high-pressure or medium-pressure turbine. The gas turbine can be, in particular, a gas turbine of an aircraft engine. In one embodiment, it has a combustion chamber preceding the turbine and one or more single-stage or multiple-stage compressors preceding this combustion chamber.

In particular, the aircraft engine can have a fan, which can be coupled to the low-pressure turbine through gearing. In one embodiment, the turbine has an adjacent, stationary mixer, arranged downstream of the exit guide grid, for mixing a flow of exhaust gas from the exit guide grid and a bypass flow of air that bypasses the combustion chamber and is parallel to the flow of exhaust gas in terms of fluid mechanics, said bypass flow of air being impelled by the fan.

The last stage or last sonic interaction is characterized by a vane-to-blade ratio characteristic quantity, V/B, which indicates the ratio of the number of guide vanes V to the number of rotating blades B of the last stage or the quotient obtained from the number of guide vanes of the exit guide grid divided by the number of rotating blades of the last rotor grid.

Surprisingly, it has been found that, by constricting the flow of exhaust gas passing through the last rotor grid after the last rotor grid, cut-off ranges for the modes k=−1, k=−2, and k=−3 of the blade-passing frequency of the last stage can be enlarged.

This then makes it possible advantageously to place the vane-to-blade ratio characteristic quantity for the last stage in a specific and reliable manner in such cut-off ranges and thereby reduce the noise emission of the turbine.

Correspondingly, according to an aspect of the present invention, the last stage will be or is designed in such a way that its vane-to-blade ratio characteristic quantity lies, in at least a predetermined operating condition of the turbine, above an upper cut-off limit $o_{k=-1}$ for the mode k=−1 or between a lower cut-off limit $u_{k=-1}$ for the mode k=−1 and an upper cut-off limit $o_{k=-2}$ for the mode k=−2 or between a lower cut-off limit $u_{k=-2}$ for the mode k=−2 and an upper cut-off limit $o_{k=-3}$ for the mode k=−3 of a blade-passing frequency of the last stage, wherein the last stage will be or is designed additionally in such a way that a flow of exhaust gas passing through the last rotor grid, in the predetermined operating condition, is reduced to a minimum flow cross section in front of the exit guide grid, in particular in a region between the last rotor grid and the exit guide grid, in the exit guide grid or within the exit guide grid, and/or after the exit guide grid, in particular in a region with an axial length corresponding to an axial length of the exit guide grid, said minimum flow cross section being at most 80%, particularly at most 75%, more particularly at most 70% of its minimum flow cross section in the last rotor grid.

The predetermined operating condition can be, in particular, a noise-critical operating condition, as considered in European Patent EP 1 738 61 B1 described in the introduction, in particular a flight take-off, a flight landing, and/or a taxiing on a tarmac of an aircraft having the turbine.

The blade-passing frequency denotes, in a manner that is known as such, the frequency with which, in the predetermined operating condition, the rotating blades rotate past a stationary guide vane of the last stage.

A minimum flow cross section in terms of the present invention is, in particular, the smallest free cross section of a flow duct segment, delimited by walls, that will be or is passed through by the flow of exhaust gas in the predetermined operating condition. The minimum flow cross section in the last rotor grid in terms of the present invention is, in particular, the smallest cross section of an axial flow duct segment between an upstream front or inflow edge and a downstream rear or outflow edge of the last rotor grid that is passed through by the flow of exhaust gas in the predetermined operating condition, it being possible for this flow duct segment to extend radially between a radially outer casing wall or a radially outer external shroud and a radially inner internal shroud of the last rotor grid. In the case of a concentric outer wall with the radius R and an inner wall with the radius r as well as the sum of the cross-section areas of the rotating blades $A_B$ between their suction and pressure sides, it can amount to $(R-r)\pi-A_B$.

The flow of exhaust gas can be constricted downstream of the last rotor grid by means of a corresponding contouring of the flow duct, in particular by means of a convergent flow duct segment in which the exit guide grid is arranged. The minimum flow cross section to which a flow of exhaust gas passing through the last rotor grid in the predetermined operating condition is reduced in the exit guide grid can then amount to $(R-r)\pi-A_V$ for a concentric outer wall with the radius R and an inner wall with the radius r as well as the sum of the cross-section areas of the guide vanes $A_V$ between the suction and pressure sides thereof.

Equivalently, the flow of exhaust gas downstream of the last rotor grid can be constricted by a corresponding divided flow, which is created by blowing in air and which extends between a wall of the flow duct and the flow of exhaust gas and thereby forms a fluidic, narrower flow duct for the flow of exhaust gas. If, for example, the divided flow has a layer thickness of δ and is created by blowing in a constricting gas from radially outside in front of the exit guide grid in a flow duct segment having a concentric outer wall with the radius R and an inner wall with the radius r, the minimum flow cross section to which a flow of exhaust gas passing through the last rotor grid is reduced in the predetermined operating condition in front of the exit guide grid amounts to $[(R-\delta)-r]\pi$.

According to an aspect of the present invention, the flow of exhaust gas is accordingly constricted by a convergent flow duct segment in front of the exit guide grid, in particular in a region between the last rotor grid and the exit guide grid, in the exit guide grid, and/or after the exit guide grid, in particular in a region with an axial length corresponding to an axial length of the exit guide grid, and hence permanently constricted under all operating conditions.

Correspondingly, the last stage in an embodiment will be or is designed in such a way that the exhaust gas flow passing through the last rotor grid is reduced to its minimum flow cross section permanently or in all operating conditions in front of the exit guide grid, in particular in a region between the last rotor grid and the exit guide grid, in the exit guide grid, and/or after the exit guide grid, in particular in a region with an axial length corresponding to an axial length of the exit guide grid, said minimum flow cross section being at most 80%, particularly at most 75%, more particularly at most 70% of its minimum flow cross section in the last rotor grid.

For this purpose, in an enhancement, a minimum radius of a radially outer casing wall of a flow duct segment, in which the exit guide grid is arranged, is at most 85%, particularly at most 82%, more particularly at most 80% of a minimum radius of a radially outer wall, in particular a radially outer casing wall or a radially outer shroud, of a flow duct segment in which the last rotor grid is arranged. A radius is understood in the present case to mean, in particular, a radial distance from an axis of rotation of the turbine. In other words, a radial outer wall of the flow duct can be moved radially inward in the direction of through-flow starting from the last rotor grid. The minimum radius of the radially outer casing wall of the flow duct segment in which the exit guide grid is positioned, in one embodiment, can be arranged between an upstream front or inflow edge and a downstream rear or outflow edge of the exit guide grid or else downstream after the rear or outflow edge of the exit guide grid or upstream before the front or inflow edge of the exit guide grid.

Such a permanent, design-dictated constriction can be implemented simply and reliably in an advantageous manner.

According to another aspect of the present invention, the flow of exhaust gas is constricted only in some operating conditions, in particular by blowing in a constricting gas and/or a by means of a variable flow duct cross section, while, in other operating conditions, it is not constricted at all or at least less so by, for example, reducing the flow of constricting gas or enlarging the variable flow duct cross section.

Correspondingly, in one embodiment, the last stage is or will be designed in such a way that the flow of exhaust gas passing through the last rotor grid is reduced in front of the exit guide grid, in particular in a region between the last rotor grid and the exit guide grid, in the exit guide grid, and/or after the exit guide grid, in particular in a region with an axial length corresponding to an axial length of the exit guide grid, in at least one other operating condition that differs from the predetermined operating condition, to a minimum cross section that is greater than 80% of its minimum flow cross section in the last rotor grid. In particular, in one embodiment, the last stage can be or is designed in such a way that the flow of exhaust gas passing through the last rotor grid is at least substantially not reduced in and/or after the exit guide grid in at least one other operating condition that is different from the predetermined operating condition, leading in the present case to a more compact design, generally referred to as a reduction to a cross section that—at least substantially—is 100% of its minimum flow cross section in the last rotor grid.

The other operating condition can be, in particular, a cruising flight of an aircraft having the turbine.

Such a temporary, variable constriction can be advantageously adapted to the respective operating condition. In particular, it is possible to improve efficiency in the cruising flight.

In an enhancement, a means of blowing in a constricting gas is provided so as to create a divided flow between a casing wall of a flow duct segment and the flow of exhaust gas in order to reduce its flow cross section in front of, in, and/or after the exit guide grid.

The means of blowing in can, in one embodiment, have one or more inlet openings in the flow duct, a source of constricting gas, in particular a suction opening, a pump, or the like, and a blocking means for separating the inlet openings from the source of constricting gas, in particular for closing the inlet openings. The constricting gas can be, in particular, ambient or cooling air. In another enhancement, the ambient air will be or is heated relative to an averaged exhaust gas temperature in the region of the last stage, by at least 200 K, in particular at least 275 K, and/or at most 625 K. In one embodiment, in the predetermined operating condition, a layer thickness of the divided flow is at least 10%, particularly at least 20%, particularly at least 30% of a minimum radius of a radially outer casing wall of a flow duct segment in which the exit guide grid is arranged.

Additionally or alternatively to a divided flow, a displaceable casing wall of a flow duct segment can be provided in order to reduce the flow cross section of the flow of exhaust gas in front of, in, and/or after the exit guide grid. For this purpose, the turbine can have, in particular, one or more movable flaps, which can be displaced radially inward in order to reduce the free cross section of the flow duct.

Vane-to-blade ratio characteristic quantities in a range between 0.6 and 0.8, particularly of at least substantially 0.7, as well as in a range between 0.35 and 0.45, particularly of at least substantially 0.4, have been found to be especially advantageous.

In one embodiment, the turbine has one or more additional stages upstream in front of the last stage, each of them having a rotating additional rotor grid with a plurality of rotating blades and an adjacent, upstream or downstream, stationary additional guide grid with a plurality of guide vanes, which are each characterized by an additional vane-to-blade ratio characteristic quantity, which indicates the ratio of the number of upstream or downstream guide vanes to the number of rotating blades of the additional stage, and will be or are designed in such a way that, in the predetermined operating condition of the turbine, these additional characteristic quantities lie above an upper cut-off limit for the mode k=−1 or between a lower cut-off limit for the mode k=−1 and an upper cut-off limit for the mode k=−2 or between a lower cut-off limit for the mode k=−2 and an upper cut-off limit for the mode k=−3 of a blade-passing frequency of the additional stage, with which their rotating blades rotate past one of their upstream or downstream guide vanes.

In one embodiment, both the last stage and the additional stage adjacent upstream of it are designed in such a way that their vane-to-blade ratio characteristic quantities are both above the upper cut-off limit for the mode k=−1 of the blade-passing frequency of the respective stage or are both between the lower cut-off limit for the mode k=−1 and the upper cut-off limit for the mode k=−2 of the blade-passing frequency of the respective stage or are both between the lower cut-off limit for the mode k=−2 and the upper cut-off limit for the mode k=−3 of the blade-passing frequency of the respective stage.

In another embodiment, the last stage and the additional adjacent stage upstream of it are designed in such a way that the vane-to-blade ratio characteristic quantities of the last stage lie above the upper cut-off limit for the mode k=−1 of the blade-passing frequency of the last stage, and the vane-to-blade ratio characteristic quantities of the additional stage lie between the lower cut-off limit for the mode k=−1 and the upper cut-off limit for the mode k=−2 or between the lower cut-off limit for the mode k=−2 and the upper cut-off limit for the mode k=−3 of the blade-passing frequency of this stage, or such that the vane-to-blade ratio characteristic quantities of the last stage lie between the lower cut-off limit for the mode k=−1 and the upper cut-off limit for the mode k=−2 of the blade-passing frequency of the last stage and the vane-to-blade ratio characteristic quantities of the additional stage lie above the upper cut-off limit for the mode k=−1 or between the lower cut-off limit for the mode k=−2 and the upper cut-off limit for the mode k=−3 of the blade-passing frequency of this stage, or such that the vane-to-blade ratio characteristic quantities of the last stage lie between the lower cut-off limit for the mode k=−2 and the upper cut-off limit for the mode k=−3 of the blade-passing frequency of the last stage and the vane-to-blade ratio characteristic quantities of the additional stage lie above the upper cut-off limit for the mode k=−1 or between the lower cut-off limit for the mode k=−1 and the upper cut-off limit for the mode k=−2 of the blade-passing frequency of this stage.

It is hereby to be noted that the vane-to-blade ratio characteristic quantity of the last stage indicates the ratio of the number of guide vanes of the upstream adjacent exit guide grid to the number of rotating blades of the last rotor grid, while the additional vane-to-blade ratio characteristic quantity of the additional stage(s) can indicate the ratio of the number of guide vanes of the upstream or downstream adjacent guide grid to the number of rotating blades of the rotor grid of this additional stage.

BRIEF DESCRIPTION OF THE DRAWINGS

Additional advantageous enhancements of the present invention ensue from the dependent claims and the following description of preferred embodiments. Shown, in part schematically, for this purpose are:

DETAILED DESCRIPTION OF THE INVENTION

Figure 1:
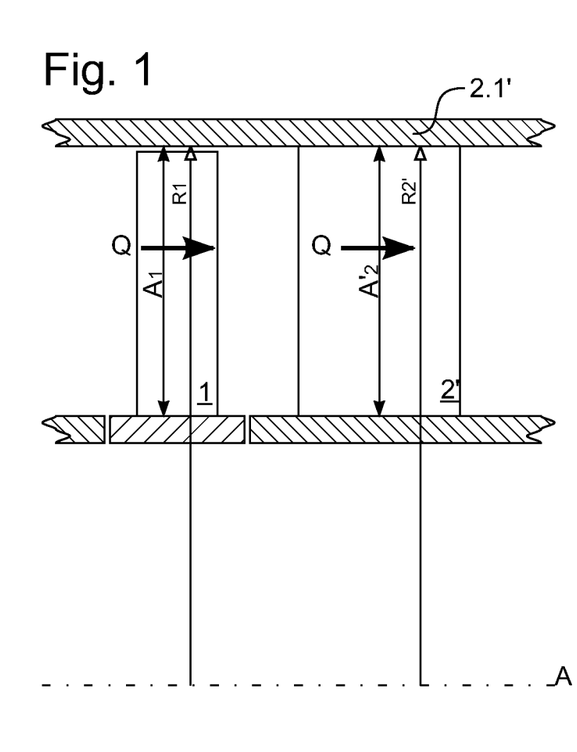
FIG. 1 a portion of a last stage of a low-pressure turbine of an aircraft engine according to previous internal company practice.
Figure 2:
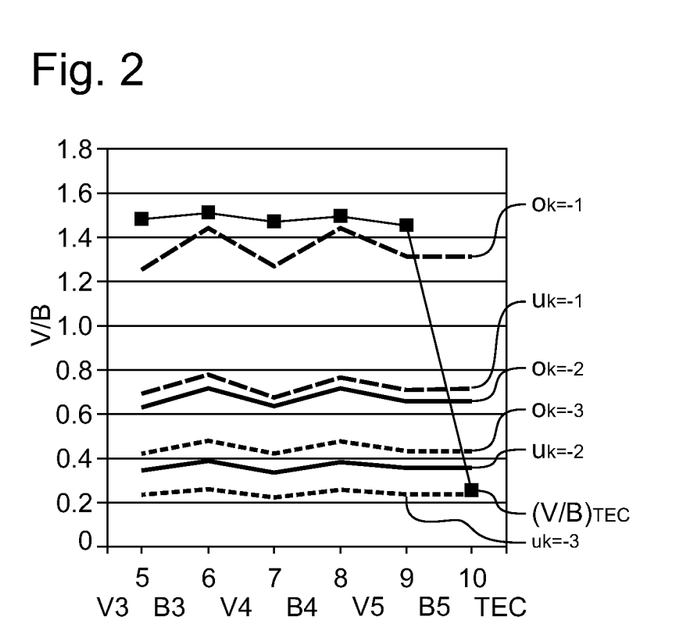
FIG. 2 a diagram to highlight a design of the low-pressure turbine of FIG. 1 according to previous internal company practice.

FIG. 2 shows a diagram for highlighting a design of a low-pressure turbine according to previous internal company practice in a depiction known from European Patent EP 1 738 061 B1 and, for this purpose, FIG. 1 shows a portion of a last stage of such a low-pressure turbine.

The last stage has a last rotor grid having a plurality of moving rotating blades 1 and an adjacent, stationary exit guide grid downstream, with a plurality of guide vanes 2, in the direction of a flow of exhaust gas Q. Arranged upstream in front of the last stage are additional stages having a rotor grid and a guide grid (not shown).

The stages are each characterized by a vane-to-blade ratio characteristic quantity V/B, which indicates the ratio of the number of guide vanes V to the number of rotating blades B of the respective stage. In the diagram of FIG. 2, the characteristic quantities $(V/B)_{TEC}$ for the last stage as well as the characteristic quantities V/B for additional stages are plotted as solid squares in the manner of depiction that is known as such from European Patent EP 1 738 061 B1. Here, the exit guide grid TEC, the last rotor grid B5 of the turbine, and additional guide grids V5, V4, V3 positioned forward of the last stage 10 in the direction of through-flow, as well as additional rotor grids B4, B3, are plotted on the abscissa.

In FIG. 2, likewise in the manner that is known as such from European Patent EP 1 738 061 B1, the respective upper cut-off limit $o_{k=-1}$ and the lower cut-off limit $u_{k=-1}$ for the mode k=−1 (dashed line in FIG. 2), the upper cut-off limit $o_{k=-2}$ and the lower cut-off limit $u_{k=-2}$ for the mode k=−2 (solid line in FIG. 2), and the upper cut-off limit $o_{k=-3}$ and the lower cut-off limit $u_{k=-3}$ for the mode k=−3 (dotted line in FIG. 2) of the blade-passing frequency for a predetermined operating condition are plotted.

It can be seen that cut-ON ranges for the mode k=−2 overlap one another between the limits $o_{k=-2}$ and $u_{k=-2}$ and for the mode k=−3 between the limits $o_{k=-3}$ and $u_{k=-3}$.

Figure 3:
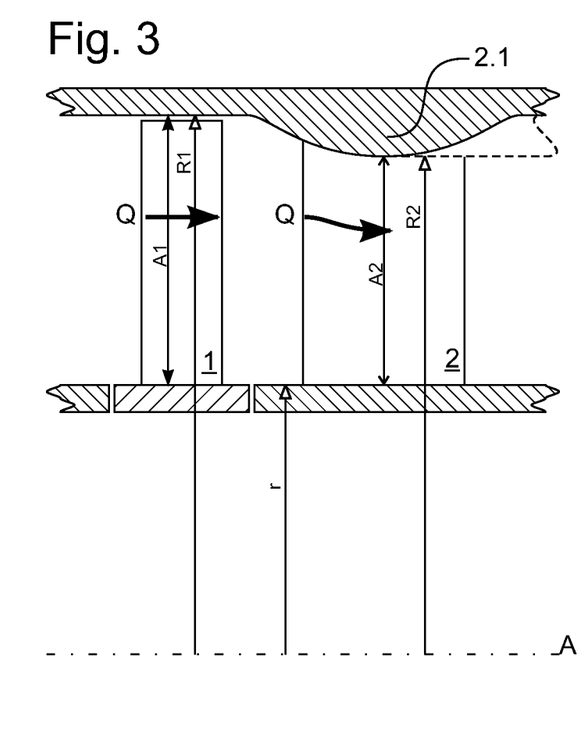
FIG. 3 a portion of a last stage of a low-pressure turbine of an aircraft engine according to an embodiment of the present invention in an illustration corresponding to FIG. 1.
Figure 4:
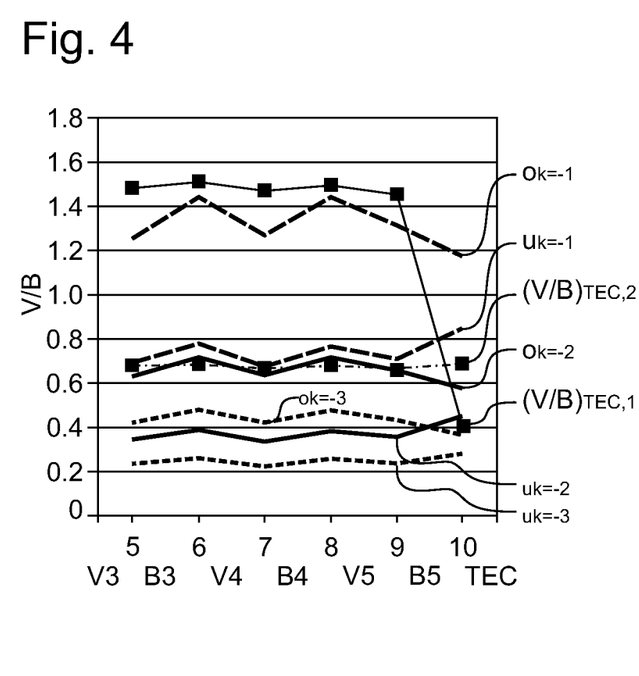
FIG. 4 a diagram to highlight a design of the low-pressure turbine of FIG. 3 according to an embodiment of the present invention in an illustration corresponding to FIG. 2.

FIGS. 4, 3 show, in turn, in a manner corresponding to that of FIGS. 2, 1, a diagram for highlighting a design of a low-pressure turbine according to an embodiment of the present invention or a portion of a last stage of such a low-pressure turbine. Aspects that correspond to each other are identified by reference numbers that correspond and, if necessary, are differentiated by an apostrophe, so that reference is made to the preceding description and, in the following, only differences will be addressed.

A combined view of FIGS. 1, 3 makes clear that the last stage of the low-pressure turbine according to the present invention (see FIG. 3) will be or is designed in such a way that a minimum radial distance from an axis of rotation A of the turbine, that is, a minimum radius R2, of a radial outer casing wall 2.1 of a flow duct segment in which the exit guide grid is arranged is at most 80% of a minimum radius R1 of a radial outer casing wall of a flow duct segment in which the last rotor grid is arranged, while the last stage of the low-pressure turbine according to previous internal company practice (see FIG. 1) will be or is designed in such a way that a minimum radius R2' of a radial outer casing wall 2.1' of a flow duct segment in which the exit guide grid is arranged corresponds substantially to the minimum radius R1 of a radial outer casing wall of a flow duct segment in which the last rotor grid is arranged.

As a result, the last stage of the low-pressure turbine according to the present invention (see FIG. 3) will be or is designed in such a way that the flow of exhaust gas Q passing through the last rotor grid is reduced in the exit guide grid permanently or in all operating conditions to a minimum flow cross section A2, which is at most 70% of its minimum flow cross section A1 in the last rotor grid. As a result, the flow of exhaust gas is constricted in the exit guide grid by a convergent flow duct segment and thus constricted permanently or in all operating conditions.

Surprisingly, it has been found that, by means of such a constriction of the flow of exhaust gas passing through the last rotor grid after the last rotor grid, the cut-off ranges for the modes k=−1, k=−2, and k=−3 of the blade-passing frequency of the last stage can be enlarged; as a combined view of FIGS. 2, 4 makes clear, the unfavorable cut-ON range between the upper cut-off limit $o_{k=-1}$ and the lower cut-off limit $u_{k=-1}$ for the mode k=−1 (dashed line in FIGS. 2, 4), between the upper cut-off limit $o_{k=-2}$ and the lower cut-off limit $u_{k=-2}$ for the mode k=−2 (solid line in FIGS. 2, 4), as well as between the upper cut-off limit $o_{k=-3}$ and the lower cut-off limit $u_{k=-3}$ for the mode k=−3 (dotted line in FIG. 2) of the blade-passing frequency are constricted in the predetermined operating condition. In a corresponding manner, the favorable cut-off ranges outside of these cut-on ranges are enlarged.

This makes it possible advantageously to place the vane-to-blade ratio characteristic quantity (V/B)$_{TEC}$ for the last stage specifically and reliably in such cut-off ranges and thereby to reduce the noise emission of the turbine.

It can be seen in FIG. 4 that the vane-to-blade ratio characteristic quantity (V/B)$_{TEC, 1}$ for the last stage lies, according to one embodiment of the present invention, at about 0.4 and thus between the lower cut-off limit $u_{k=-2}$ for the mode k=−2 and the upper cut-off limit $o_{k=-3}$ for the mode k=−3 of the blade-passing frequency.

By contrast, the adjacent additional stages upstream of the last stage will be or are designed in such a way that their vane-to-blade ratio characteristic quantities V/B lie above the upper cut-off limit $o_{k=-1}$ for the mode k=−1 of the blade-passing frequency of the respective stage.

It can be seen in a combined view of FIGS. 2, 4 that the constriction of the flow of exhaust gas Q for the last stage according to the invention results in a cut-off range between the lower cut-off limit $u_{k=-2}$ for the mode k=−2 and the upper cut-off limit $o_{k=-3}$ for the mode k=−3 (see FIG. 4) that does not exist in the design according to previous internal company practice (see FIG. 2) and that by the design according to the invention of the vane-to-blade ratio characteristic quantity (V/B)$_{TEC, 1}$ for the last stage in this cut-off range, a noise reduction of the turbine is possible for favorable numbers of blades.

In FIG. 4, the vane-to-blade ratio characteristic quantity (V/B)$_{TEC, 2}$ for the last stage as well as the vane-to-blade ratio characteristic quantities V/B for additional stages for turbines according to another embodiment of the present invention, which, apart from these characteristic quantities, are identical in construction to the above-described turbines according to an embodiment of the present invention, are plotted as dash-dots or as solid squares, so that reference is made to the above description and FIG. 3 and, in the following, only differences will be addressed.

In this additional embodiment, the vane-to-blade ratio characteristic quantity (V/B)$_{TEC, 2}$ for the last stage lies at about 0.7 and thus between the lower cut-off limit $u_{k=-1}$ for the mode k=−1 and the upper cut-off limit $o_{k=-2}$ for the mode k=−2 of the blade-passing frequency.

The adjacent additional stages upstream of the last stage will be or are likewise designed in such a way that their vane-to-blade ratio characteristic quantities V/B lie between the lower cut-off limit $u_{k=-1}$ for the mode k=−1 and the upper cut-off limit $o_{k=-2}$ for the mode k=−2 of the blade-passing frequency.

It can be seen in a combined view of FIGS. 2, 4 that, as a result of the constriction of the flow of exhaust gas Q according to the invention for the last stage, the cut-off range between the lower cut-off limit $u_{k=-1}$ for the mode k=−1 and the upper cut-off limit $o_{k=-2}$ for the mode k=−2 is enlarged in comparison with the embodiment according to previous internal company practice (see FIG. 2), so that, by means of the design of the blade to vane vane-to-blade ratio characteristic quantity (V/B)$_{TEC, 2}$ for the last stage in this cut-off range, a noise reduction of the turbine is reliably made possible.

In a modification, the turbine has a stationary mixer adjacent downstream of the exit guide grid for mixing a flow of exhaust gas emerging from the exit guide grid and a bypass air flow bypassing the combustion chamber, which is impelled by a fan (not shown).

In another modification, the radial inward displacement of the outer wall of the flow duct is also retained downstream of the exit guide grid, as highlighted in FIG. 3 by a dashed line.

The predetermined operating condition that dictates the above-mentioned cut-off limits $o_{k=-1}, \ldots, u_{k=-3}$ can be, in particular, a noise-critical operating condition, as is considered in European Patent 1 738 061 B1 described in the introduction, in particular a flight take-off, a flight landing, and/or a taxiing on a tarmac of an aircraft having the turbine.

As indicated in FIG. 3, the minimum flow cross section A1 in the last rotor grid in terms of the present invention, in the predetermined operating condition, is the smallest free cross section of the flow duct segment through which the flow of exhaust gas passes between an upstream (left in FIG. 3) front edge or inflow edge and a downstream (right in FIG. 3) rear edge or outflow edge of the last rotor grid. In the exemplary embodiment with the radius r of the inner wall as well as the sum of cross-section surface areas of the rotating blades $A_B$, it amounts to A1=(R1-r)π-$A_B$.

In the embodiment of FIG. 3, the flow of exhaust gas Q is constricted downstream of the last rotor grid by a corresponding convergent contouring of the flow duct segment in which the exit guide grid is arranged. Therefore, the minimum flow cross section A2 to which the flow of exhaust gas Q passing through the last rotor grid is reduced in the predetermined operating condition in the exit guide grid, with the sum of the cross-section surface areas of the guide vanes $A_V$, amounts to A2=(R2-r)π-$A_V$.

In the same way, the flow of exhaust gas can be constricted downstream of the last rotor grid by a corresponding divided flow T with a layer thickness δ, said divided flow being created by blowing in constricting gas and extending between a wall 2.1' of the flow duct and the flow of exhaust gas Q and thus forming a fluidic, narrow flow duct for the flow of exhaust gas.

Figure 5:
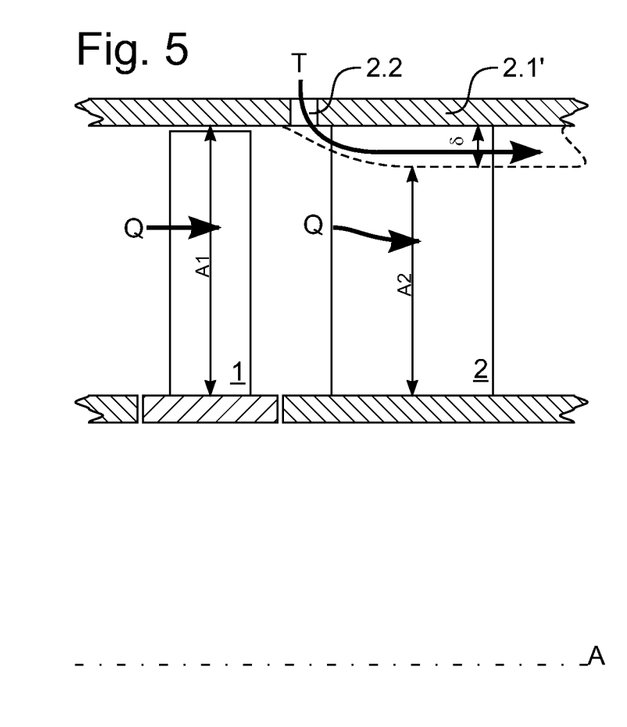
FIG. 5 a portion of a last stage of a low-pressure turbine of an aircraft engine according to another embodiment of the present invention in an illustration corresponding to FIG. 3.

For this purpose, FIG. 5 shows, in a way corresponding to FIG. 3, a portion of a last stage of such a low-pressure turbine according to another embodiment of the present invention. Aspects that correspond to each other are, in turn, identified by corresponding reference numbers, so that reference is made to the preceding description and, in the following, only differences will be addressed.

In the embodiment of FIG. 5, the turbine has a blowing means for blowing in a constricting gas in order to create the divided flow T between the casing wall 2.1' of a flow duct segment and the flow of exhaust gas Q, so as to reduce its flow cross section in front of, in, and after the exit guide grid.

The blowing means has a plurality of inlet openings 2.2 in the flow duct, a source of constricting gas, and a blocking means separating the inlet openings from the source of constricting gas as desired (not shown). The constricting gas is ambient air, which, with respect to an averaged exhaust gas temperature in the region of the last stage, will be or is heated by about 300 K. As a result, the sonic noise in the flow of the constricting gas expands in the region of the last stage at a different speed than does the sonic noise in the flow of exhaust gas.

In this way, it is possible, as desired, depending on the operating condition, in particular a noise-critical operating condition described above, to constrict the flow of exhaust gas Q. As a result, the cut-off ranges for the modes k=−1, k=−2, and k=−3 of the blade-passing frequency of the last stage, described with reference to FIG. 4, can once again be enlarged and the last stage will be or is designed in such a way that, in a predetermined noise-critical operating condition, the characteristic quantity $(V/B)_{TEC,\,1}$ or $(V/B)_{TEC,\,2}$ lies between the lower cut-off limit $u_{k=-2}$ for the mode k=−2 and the upper cut-off limit $o_{k=-3}$ for the mode k=−3 or between the lower cut-off limit $u_{k=-1}$ for the mode k=−1 and the upper cut-off limit $o_{k=-2}$ for the mode k=−2. In another operating condition, in particular during a cruising flight of an aircraft having the turbine, the constriction can be eliminated by closing the inlet openings 2.2.

Such a temporary, variable constriction can also be represented by a displaceable casing wall of a flow duct segment.

Figure 6:
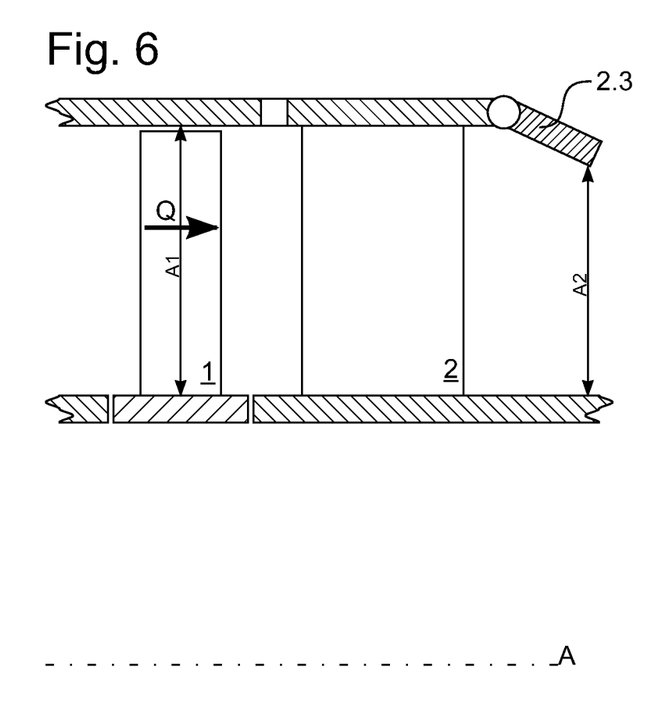
FIG. 6 a portion of a last stage of a low-pressure turbine of an aircraft engine according to another embodiment of the present invention in an illustration corresponding to FIG. 5.

For this purpose, FIG. 6 shows, in a way corresponding to FIGS. 3, 5, a portion of a last stage of such a low-pressure turbine according to another embodiment of the present invention. Aspects that correspond to each other are once again identified by corresponding reference numbers, so that reference is made to the preceding description and, in the following, only differences will be addressed.

In the embodiment of FIG. 6, the turbine has a plurality of movable flaps 2.3, which can be displaced radially inward in order to reduce the free cross section A2 of the flow duct.

In this way, it is possible, as desired, depending on the operating condition, in particular a noise-critical operating condition described above, to constrict the flow of exhaust gas Q. As a result, the cut-off ranges for the modes k=−1, k=−2, and k=−3 of the blade-passing frequency of the last stage, described with reference to FIG. 4, can once again be enlarged and the last stage will be or is designed in such a way that, in the predetermined noise-critical operating condition, the characteristic quantity $(V/B)_{TEC,\,1}$ or $(V/B)_{TEC,\,2}$ lies between the lower cut-off limit $u_{k=-2}$ for the mode k=−2 and the upper cut-off limit $o_{k=-3}$ for the mode k=−3 or between the lower cut-off limit $u_{k=-1}$ for the mode k=−1 and the upper cut-off limit $o_{k=-2}$ for the mode k=−2. In another operating condition, in particular during a cruising flight of an aircraft having the turbine, the constriction can be eliminated by opening the flaps 2.3.

Although the preceding description describes exemplary embodiments, it is noted that a large number of modifications are possible. In addition, it is noted that the exemplary embodiments are merely examples, which in no way shall limit the protective scope, the applications, and the construction. Instead, the preceding description provides the person skilled in the art with guidelines for implementing at least one exemplary embodiment, with it being possible to make diverse alterations, in particular in regard to the function and arrangement of the described components, without departing from the protective scope, as ensues from the claims and combinations of features equivalent to these.

The invention claimed is:

1. A method for designing a turbine of a gas turbine aircraft engine, which has a last stage with a rotating last rotor grid, having a plurality of rotating blades, and an adjacent upstream, stationary exit guide grid, having a plurality of guide vanes; with the last stage being characterized by a vane-to-blade ratio characteristic quantity, which indicates the ratio of the number of guide vanes to the number of rotating blades;

wherein the last stage is configured and arranged where the vane-to-blade ratio characteristic quantity lies, in a predetermined operating condition of the turbine, above an upper cut-off limit $(o_{k=-1})$ for the mode k=−1 or between a lower cut-off limit $(u_{k=-1})$ for the mode k=−1 and an upper cut-off limit $(o_{k=-2})$ for the mode k=−2 or between a lower cut-off limit $(u_{k=-2})$ for the mode k=−2 and an upper cut-off limit $(o_{k=-3})$ for the mode k=−3 of a blade-passing frequency of the last stage, with which its rotating blades rotate past one of it guide vanes;

that, in the predetermined operating condition, a flow of exhaust gas passing through the last rotor grid is reduced to a minimum flow cross section, which is at most 80% of its minimum flow cross section in the last rotor grid, in front of the exit guide grid, in a region between the last rotor grid and the exit guide grid, in the exit guide grid, and/or after the exit guide grid, in a region with an axial length that corresponds to an axial length of the exit guide grid; and manufacturing the turbine using the results of the design steps.

2. The method according to claim 1, wherein the last stage is configured and arranged with the flow of exhaust gas passing through the last rotor grid is reduced permanently to a minimum flow cross section, which is at most 80% of its minimum flow cross section in the last rotor grid, in front of the exit guide grid, in a region between the last rotor grid and the exit guide grid, in the exit guide grid, and/or after the exit guide grid, in a region with an axial length that corresponds to an axial length of the exit guide grid.

3. The method according to claim 2, wherein a minimum radius of a radial outer casing wall of a flow duct segment in which the exit guide grid is arranged is at most 85% of a minimum radius of a radial outer wall of a flow duct segment in which the last rotor grid is arranged.

4. The method according to claim 1, wherein the last stage is configured and arranged where, in an additional operating condition that differs from the predetermined operating condition, the flow of exhaust gas passing through the last rotor grid is reduced to a minimum flow cross section, which is greater than 80% of its minimum flow cross section in the last rotor grid, in front of the exit guide grid, in a region between the last rotor grid and the exit guide grid, in the exit guide grid, and/or after the exit guide grid, in a region with an axial length that corresponds to an axial length of the exit guide grid, and is at least substantially not reduced.

5. The method according to claim 4, wherein a blowing means for blowing in a constricting ambient air gas that is heated, in order to create a divided flow between a casing wall of a flow duct segment and the flow of exhaust gas, so as to reduce its flow cross section in front of the exit guide grid, in a region between the last rotor grid and the exit guide grid, in the exit guide grid, and/or after the exit guide grid, in a region with an axial length that corresponds to an axial length of the exit guide grid.

6. The method according to claim 4 further comprising the step of providing a displaceable casing wall of a flow duct segment to reduce the flow cross section of the flow of exhaust gas in front of the exit guide grid, in a region between the last rotor grid and the exit guide grid, in the exit guide grid, and/or after the exit guide grid, in a region with an axial length that correspond to an axial length of the exit guide grid.

7. The method according to claim 1, wherein the last stage is configured and arranged where the vane-to-blade ratio characteristic quantity is at least 0.6 and/or at most 0.8.

8. The method according to claim 1, wherein the last stage is configured and arranged where the vane-to-blade ratio characteristic quantity is at least 0.35 and/or at most 0.45.

9. The method according to claim 1, wherein the turbine has at least one additional stage upstream in front of the last stage with an additional rotating rotor grid, having a plurality of rotating blades, and an adjacent, additional stationary guide grid upstream or downstream of it, having a plurality of guide vanes, with the additional stage being characterized by an additional characteristic quantity, which indicates the ratio of the number of guide vanes to the number of rotating blades of the additional stage, and with the additional stage being designed in such a way that this additional characteristic quantity lies, in the predetermined operating condition of the turbine, above an upper cut-off limit for the mode $k=-1$ or between a lower cut-off limit for the mode $k=-1$ and an upper cut-off limit for the mode $k=-2$ or between a lower cut-off limit for the mode $k=-2$ and an upper cut-off limit for the mode $k=-3$ of a blade-passing frequency of the additional stage, with which its rotating blades rotate past one of its guide vanes.

10. The method according to claim 1, wherein the last stage has a vane-to-blade ratio characteristic quantity, which indicates the ratio of the number of guide vanes to the number of rotating blades; the turbine being a gas turbine of an aircraft engine, which has a last stage having a rotating last rotor grid, having a plurality of rotating blades, and an adjacent, downstream, stationary exit guide grid and having a plurality of guide vanes.

* * * * *